US012604772B2

(12) United States Patent (10) Patent No.: US 12,604,772 B2
Wenmaekers et al. (45) Date of Patent: Apr. 14, 2026

(54) LED ELECTRICAL CONTACT FOR 3D LEDs

(71) Applicant: LUMILEDS LLC, San Jose, CA (US)

(72) Inventors: Erik Wenmaekers, Hulsberg (NL);
Josef Andreas Schug, Würselen (DE);
Florian Helling, Viersen (DE);
Christian Kleijnen, Ell (NL); **Georg
Friedrich Alfons Henninger**, Aachen
(DE)

(73) Assignee: Lumileds Singapore Pte. Ltd.,
Singapore (SG)

( * ) Notice: Subject to any disclaimer, the term of this
patent is extended or adjusted under 35
U.S.C. 154(b) by 520 days.

(21) Appl. No.: 18/080,445

(22) Filed: Dec. 13, 2022

(65) Prior Publication Data

US 2023/0187419 A1     Jun. 15, 2023

Related U.S. Application Data

(60) Provisional application No. 63/288,928, filed on Dec.
13, 2021.

(51) Int. Cl.
*H01L 25/075*        (2006.01)
*F21S 45/10*         (2018.01)
(Continued)

(52) U.S. Cl.
CPC ............. *H10W 90/00* (2026.01); *F21S 45/10*
(2018.01); *H05K 1/181* (2013.01); *H05K
3/284* (2013.01); *H05K 3/3426* (2013.01);
*H01R 12/523* (2013.01); *H05K 2201/10106*
(2013.01); *H05K 2201/1031* (2013.01); *H05K
2201/10325* (2013.01); *H05K 2201/10378*
(2013.01); *H05K 2203/1316* (2013.01)

(58) Field of Classification Search
CPC ... F21V 23/06; H01L 25/0753; H01R 12/523;
H05K 1/181
See application file for complete search history.

(56) References Cited

U.S. PATENT DOCUMENTS 6,273,587 B1 *  8/2001  Demshki ................... F21S 4/20
                                              362/235
10,591,114 B1 *  3/2020  Lassen ................... F21V 15/013
                        (Continued)

FOREIGN PATENT DOCUMENTS

WO      WO-2006017595 A2 *   2/2006  ............... F21S 4/22
WO         2020/016076        1/2020

OTHER PUBLICATIONS

International Search Report and Written Opinion mailed Apr. 18,
2023 for PCT International Application No. PCT/US2022/052698.
(Continued)

*Primary Examiner* — Zheng Song
(74) *Attorney, Agent, or Firm* — Volpe Koenig

(57)                    ABSTRACT

An electrical contact, a 3D LED and a method of manufac-
turing 3D LEDs are described. The electrical contact
includes a printed circuit board (PCB) bridge and a PCB
connector. The PCB bridge comprises at least one electrical
contact. The at least one electrical contact is configured for
electrical coupling with at least one interposer of a string of
LEDs. The PCB connector is electrically coupled to the PCB
bridge. The PCB connector comprises an electrical contact
configured for electrical coupling with at least one external
electrical wire.

6 Claims, 9 Drawing Sheets

(51) Int. Cl.
| | |
|---|---|
| *H05K 1/181* | (2026.01) |
| *H05K 3/28* | (2006.01) |
| *H05K 3/341* | (2026.01) |
| *H10W 90/00* | (2026.01) |
| *H01R 12/52* | (2011.01) |

(56) References Cited

U.S. PATENT DOCUMENTS

| | | | | |
|---|---|---|---|---|
| 2003/0071581 A1* | 4/2003 | Panagotacos | ........... | G09F 13/22 |
| | | | | 315/185 R |
| 2009/0021529 A1* | 1/2009 | Wendler | ................. | G09F 13/22 |
| | | | | 345/619 |
| 2010/0314655 A1* | 12/2010 | Thompson | ............. | H05K 1/189 |
| | | | | 257/E33.066 |
| 2012/0300462 A1* | 11/2012 | Bergeron | ................ | F21V 23/06 |
| | | | | 174/250 |
| 2013/0051022 A1 | 2/2013 | Katzler et al. | | |
| 2020/0116310 A1* | 4/2020 | May | ......................... | F21K 9/66 |
| 2020/0363048 A1* | 11/2020 | Suttles | ................. | F21V 23/008 |
| 2020/0413538 A1* | 12/2020 | Gipson | ................ | H05K 7/1427 |
| 2021/0302014 A1* | 9/2021 | Kalliche | .................... | F21S 4/20 |
| 2023/0250947 A1* | 8/2023 | Afan | ................... | F21V 19/0035 |
| | | | | 439/74 |

OTHER PUBLICATIONS

Myledy, IP68 Silicone Solid Tube LED Strip Connector, https://www.myledy.com/product/ip68-silicon-tube-led-strip-connector/ Available at: https://web.archive.org/web/20210511123301/https://www.myledy.com/product/ip68-silicon-tube-led-strip-connector/ (May 11, 2021).

Nexlide of LG Innotek, Main Products, Lightingmodule: Uniform/Slim/Highefficiency (2021).

* cited by examiner

1300

START

1310 — Connect a PCB bridge to at least one interposer.

1320 — Encapsulate the PCB bridge and the strand of LEDs in a silicone housing.

1330 — Connect at least one electrical wire to a PCB connector.

1340 — Connect the PCB connector and the PCB bridge.

FINISH

LED ELECTRICAL CONTACT FOR 3D LEDs

CROSS REFERENCE TO RELATED APPLICATION(S)

This application claims the benefit U.S. Patent Application Ser. No. 63/288,928, filed Dec. 13, 2021, which is incorporated by reference as if fully set forth.

BACKGROUND

Automotive lighting, including but not limited to front position light, daytime running light, front and rear turn signals, rear stop and tail lights, car body contour lines, roof rails, grill area, and interior, are often designed as line emitters or surface emitters. These applications often require high mechanical flexibility, high fluxes, high uniformity and compactness. Light emitting diodes (LEDs) on wire may be used as a light source to meet these criteria. The LEDs operate on electricity which is supplied by the vehicle. A solution is required that connects electrical wires of the vehicle to the LEDs.

SUMMARY

An electrical contact, a 3D LED and a method of manufacturing 3D LEDs are described. The electrical contact includes a printed circuit board (PCB) bridge and a PCB connector. The PCB bridge comprises at least one electrical contact. The at least one electrical contact is configured for electrical coupling with at least one interposer of a string of LEDs. The PCB connector is electrically coupled to the PCB bridge. The PCB connector comprises an electrical contact configured for electrical coupling with at least one external electrical wire.

BRIEF DESCRIPTION OF THE DRAWINGS

A more detailed understanding can be had from the following description, given by way of example in conjunction with the accompanying drawings wherein.

DETAILED DESCRIPTION

Figure 1:
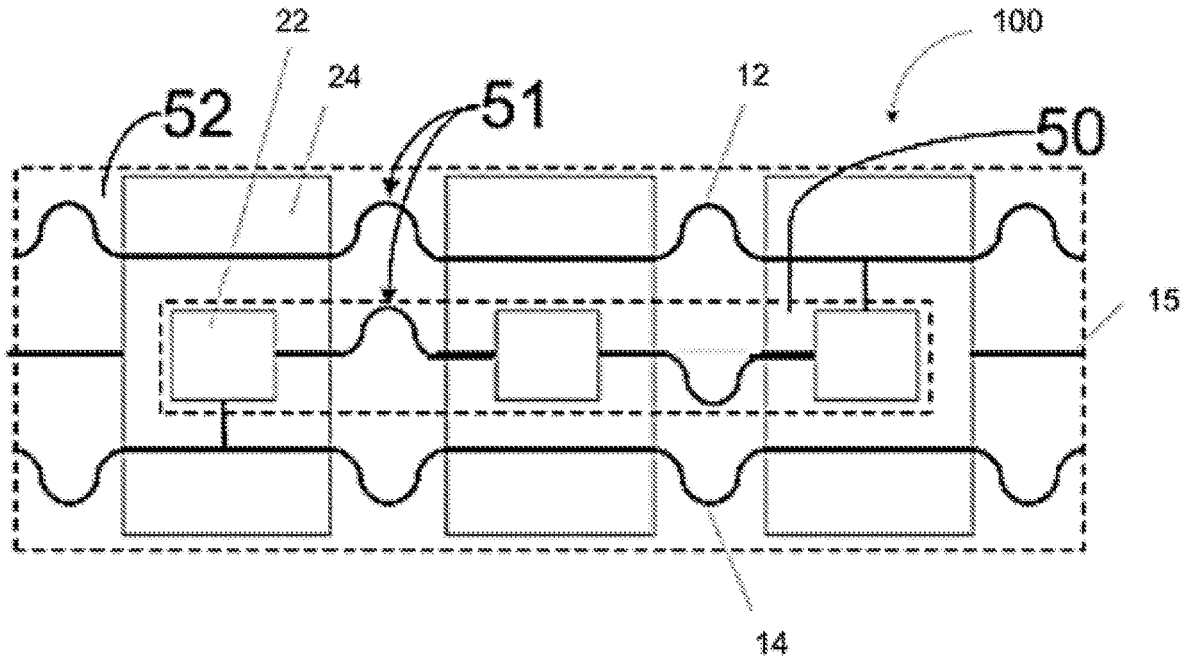
FIG. 1 is a schematic view of a top view of a 3D LED.

Examples of light emitting diodes (LED) electrical contacts for 3D LEDs will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present disclosure. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures, unless explicitly stated otherwise. It will be understood that these terms are intended to encompass different orientations of the device in addition to the orientation depicted in the figures.

Automotive lighting applications may include but are not limited to car body contour lines, roof rails, and grill areas. Additionally, vehicles are including more interior lighting. This lighting is often designed as line emitters or surface emitters. These applications require a light source that has high mechanical flexibility, high fluxes, high uniformity and compactness. An example of a light source that is ideal for these applications is a 3D LED. A 3D LED may be a bendable, elongated light source, which can be integrated as a line emitter or combined with optical elements to create a surface light. In some embodiments, the 3D LED may be a small, e.g. 10 mm long, LED lighting strip. If longer strips are desired, multiples of such design blocks can be joined up to a maximum length. The final strip may be completed by adding beginning and end parts to the design, and adding an electrical connector for plugging into the car's electrical system. WO2020016076A1 describes the construction principle and basic manufacturing method for such an LED lighting strip and is hereby incorporated by reference herein.

A 3D LED may include a string of LEDs on a wire assembled or embedded in a silicone housing. The LEDs may operate on an electrical current supplied by the vehicle. The wiring of the vehicle and the inner LEDs must, therefore, be electrically coupled.

The electrical coupling or contact between the wire of the vehicle and the inner LED string may, however, be challenging due to space restrictions created by the housing encapsulating the string of LEDs. By way of example, adding a standard SMD contact to the string of LEDs may require space for contact terminals on the PCB. However, the required space may not be available within the molded housing encapsulating the string of LEDs. Additionally, if the contact were to be soldered to the PCB of the LED string, it may result in a high risk of burning or melting the molded housing. Further, the contact terminal could pass through the LED PCB and obstruct the optical side of the LED string. Therefore, an electrical contact for 3D LED technology that electrically couples an LED string to the electrical system of a vehicle and extends beyond the silicone housing of the LED string, yet has a compact design, may be advantageous.

FIG. 1 schematically shows a top view of a 3D LED lighting strip 100, or, more precisely, a section of LED lighting strip 100. Similar sections to the section shown in FIG. 1 may be connected, or the section shown in FIG. 1 may continue to the left and the right of the section shown to form a complete or full LED lighting strip 100. The illustrated LED lighting strip 100 comprises three wires 12, 14 and 15. Two of the wires are outer wires and may be referred to as a cathode wire 14 and an anode wire 12. A third one of the three wires may be referred to as a central wire 15. LEDs 22 may be arranged along the strip to form a longitudinal LED lighting strip 100. The LEDs 22 may be directly connected to the wires 12, 14, 15 or, as shown in FIG. 1, may be mounted on interposers 24 (or carriers). In embodiments where interposers 24 or carriers are used, the wires 12, 14, 15 may be connected to the interposers 24 or carriers to make the electrical connection to the LEDs provided thereon. The wires 12, 14, 15 may be continuous or may be segmented. In embodiments where the wires are segmented, they may include wire segments that may be connected, for example, by soldering to pads of the interposers 24. The LED lighting strip 100 may also include an enclosing member or housing 52, which may enclose the wires 12, 14, 15, the LEDs 22, and the interposers 24. The housing 52 may be filled up with an encapsulation material 53 up to the upper edge 54 of the housing. The encapsulation material 53 may be silicone. The encapsulation material 53 may be transparent to allow light from the LED pass through.

FIG. 1 shows three consecutive LEDs 22 arranged in a group 50. In the example illustrated in FIG. 1, each of the three LEDs 22 in the group 50 are electrically coupled together in series by the central wire 15. Each group may have one LED connected to the outer wire 14 and one LED connected to the outer wire 12, for example. Iterating the section shown in FIG. 1 to the left and right, thus, may yield consecutive LED groups 50, with the LEDs 22 within each group 50 being in an electrical series connection via the inner wire 15, and the groups 50 being electrically coupled in parallel to each other via the outer wires 12, 14. Bends 51 in the outer wires 12, 14 and bends 51 between at least some of the LEDs 22 in the central wire 15, may allow bending and twisting of the LED lighting strip 100, for example, into three-dimensional shapes to form a 3D LED.

While the bends 51 in the outer wires 12, 14 may provide sufficient flexibility for the bendability and twistability of the LED lighting strip 100, the thermal expansions of the constituents of the LED lighting strip 100 may be different depending on changing ambient temperatures and on switching on and off the LEDs of the strip 100. In particular, the thermal expansion of the enclosing member or housing 52, comprising, for example, a silicone rubber, and of the central wire 15, comprising, for example, copper or a copper alloy like CuFe2P or CuNiSi, may present an issue in some situations that may be alleviated by introducing bends 51 in the central wire 15. As said, as long as the necessary distance between wires is kept also during bending and twisting, many bend shapes, including straight portions, are within the scope of the embodiments described herein.

Together, the wires 12, 14, 15 and flexible housing 52 may provide bendability and twistability of the LED lighting strip 100, which may be advantageous for vehicle signal and styling lights. Example LED electrical contacts for 3D LEDs are described below with respect to FIGS. 2-12 and may provide a mechanism to electrically connect the 3D LED lighting strip 100 shown in FIG. 1 to the electrical system of the vehicle.

Figure 2:
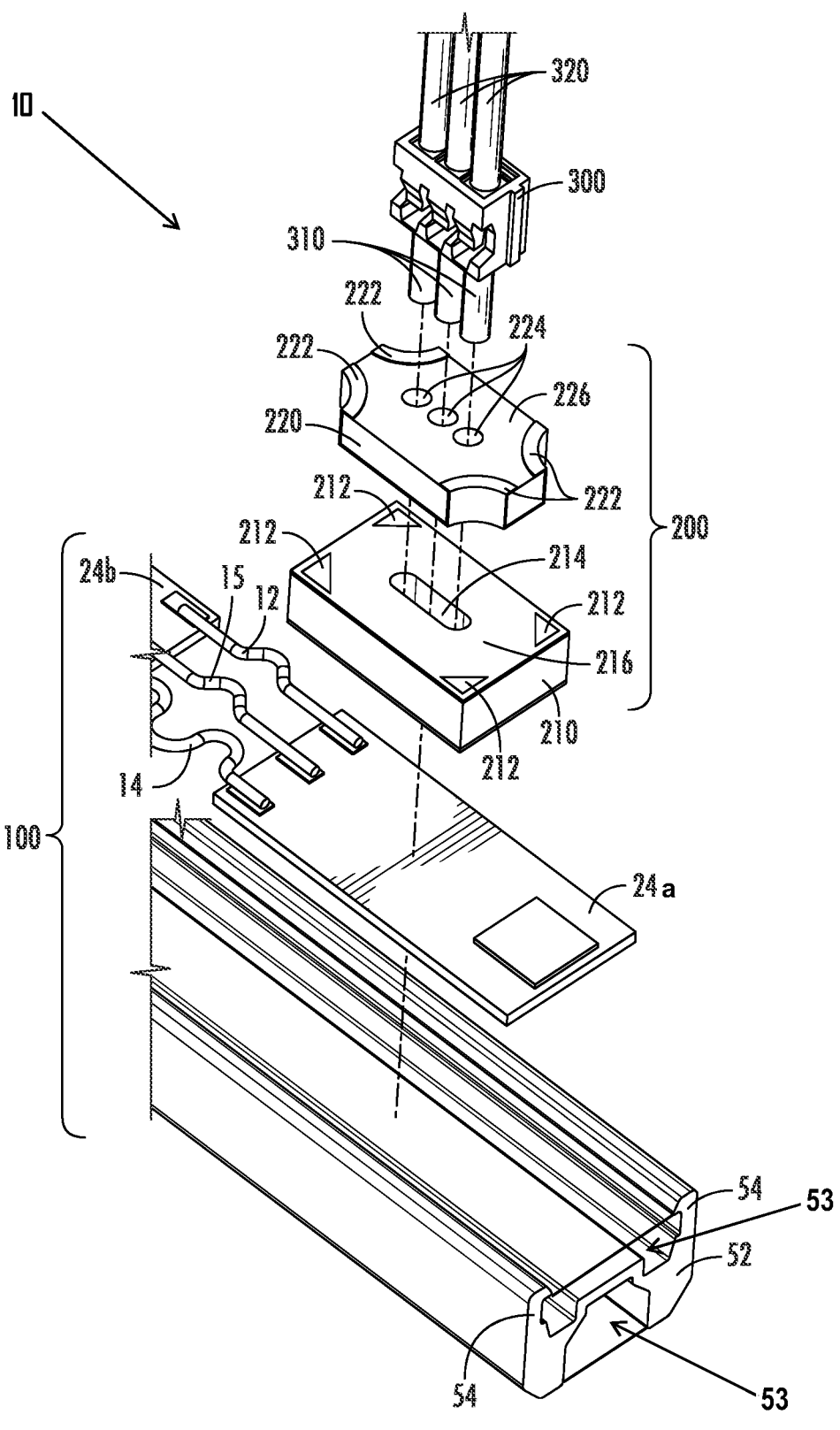
FIG. 2 is an exploded view of a 3D LED with an electrical contact.

FIG. 2 is an exploded view of an example 3D LED lighting strip with an electrical contact 10. The illustrated 3D LED lighting strip with an electrical contact 10 includes a LED lighting strip 100 and an electrical contact 200. As previously described, the 3D LED lighting strip 100 may include a flexible housing 52, interposers 24a, 24b, LEDs 22 (not visible in FIG. 2), and wires 12, 14, 15. The interposers 24 may be inner interposers 24b, which may be connected on either side to other inner interposers 24b, and end interposers 24a, which may define the end of the LED light strip 100. Although not shown in FIG. 2, the interposers 24a, 24b may include at least one LED 22 on the surface with their light-emitting faces facing the housing 52. The interposers 24a, 24b, wires 12, 14, 15, and LEDs 22 may be embedded or enclosed by the housing 52. The housing 52 may be formed from a flexible material such as silicone. Although not shown in FIG. 2, the housing 52 may include openings at the location of the LEDs 22 to allow light from the LEDs 22 to pass through the housing 52.

The electrical contact 200 may electrically couple or connect the LED lighting strip 100 to an external power source, such as electrical wires of a vehicle. The electrical contact 200 may include a PCB bridge 210 and a PCB connector 220. The PCB bridge 210 may be configured to be electrically coupled or connected to an end interposer 24a. The end interposer 24a may a combined interposer 24a that spans the distance of at least two inner interposers 24b. The end interposer 24a may be the size of at least two inner interposers 24b to create an adequately sized area to receive and connect with the PCB bridge 210. Because the end interposers 24a are larger in size, the end interposers 24a may have more LEDs 22 than the inner interposers 24b. For example, the end interposers 24a may have double the LEDs 22 as an inner interposer 24b. The PCB bridge 210 may be soldered to the interposer 24a. For example, the PCB bridge 210 may be connected to the end interposer 24a in the same reflow process as, for example, the LEDs 22, wires 12, 14, 15, and TVS diodes if applicable. The PCB bridge 210 may have a thickness that may allow a top surface 216 of the PCB bridge 210 to extend beyond the upper edge 54 of the housing 52 and the encapsulation material 53.

The PCB bridge 210 may include at least one solder pad 212. For example, the PCB bridge 210 may have four solder pads 212 with one solder pad 212 at each corner. The solder pads 212 may connect the PCB connector 220 to the PCB bridge 210. The PCB bridge 210 may include an opening 214. The opening 214 in the PCB bridge 200 may be configured to receive terminal pins 310 of electrical wires 320. The opening 214 may be a single cylindrical opening that receives a plurality of terminal pins 310. For example, the opening 214 in FIG. 2 receives three terminal pins 310.

The PCB connector 220 may connect to the top surface 216 of the PCB bridge 210. The PCB connector 220 may electrically couple to the PCB bridge 210. The PCB connector 220 may include at least one castellation 222. The castellations 222 may include solder pads that extend to the bottom surface of the PCB connector 220. The castellations 222 may be arc shaped. The arc shaped castellations 222 may create space so that the castellations 222 may be soldered to the solder pads 212 of the PCB bridge 210 with ease. Additionally, the PCB connector 220 may have a smaller width and/or length than the PCB bridge 222 to create space so that the PCB connector 220 may be soldered to the PCB bridge 210 with ease. As shown in FIG. 2, the PCB connector 220 may include four castellations 222 with one castellation 222 at each corner of the PCB connector 220. The location of the castellations 222 may correspond to the location of the solder pads 212 of the PCB bridge 210. The solder pads of the castellations 222 may be soldered to the solder pads 212 of the PCB bridge 210 to connect the PCB connector 220 to the PCB bridge 210. The castellations 222 may be soldered to the solder pads 212 of the PCB bridge 210 with laser soldering, either with printed solder or with solder wire feeding. While FIG. 2 illustrates four castellations 222 and solder pads 212 located at the corners, different locations and different numbers of castellations 222 and corresponding solder pads 212 may be satisfactory to connect the PCB connector 220 to the PCB bridge 210. Alternatively, the PCB connector 210 may not include any castellations 222. Instead, a complete edge of the PCB connector 210 may be soldered to the PCB bridge 220. Because the top surface 216 of the PCB bridge 210 extends beyond the upper edge 54 of the housing 52, the PCB connector 220 may be soldered to the PCB bridge 210 without risk of burning, melting, or otherwise damaging the housing 52.

The PCB connector 220 may include at least one opening 224 to receive the terminal pins 310 of the electrical wires 320. The terminal pins 310 may enter through a top surface 226 of the PCB connector 220 and extend through the PCB connector 220. After the terminal pins 310 are inserted into the PCB connector 220, the terminal pins 310 are soldered to a bottom surface, not visible in FIG. 2, of the PCB connector 220. The bottom surface of the PCB connector 220 may be opposite the top surface 226 of the PCB connector 200 and adjacent to the top surface 216 of the PCB bridge 210. The number of openings 224 in the PCB connector 220 may correspond to the number of terminal pins 310. For example, the PCB connector 220 in FIG. 2 includes three openings 224 positioned and sized to receive three terminal pins 310. When the PCB connector 220 is connected to the PCB bridge 210, the terminal pins 310 insert into the opening 214 of the PCB bridge 210.

The electrical wires 320 may be contained by a connector housing 300. The connector housing 300 may abut the PCB connector 220 when the terminal pins 310 are inserted into the PCB connector 220. Although not shown in FIG. 2, a second end of the electrical wires 320 opposite the connector housing 300 may include a second connector configured to connect to vehicular electrical wires. The vehicular electrical wires may supply electricity via the electrical wire 320, terminal pin 310, PCB connector 220, PCB bridge 210, and interposer 24a connection to the string of LEDs.

FIGS. 3-8 illustrate an example process of assembling the example 3D LED light strip 100 and electrical contact 200 shown in FIG. 2.

Figure 3:
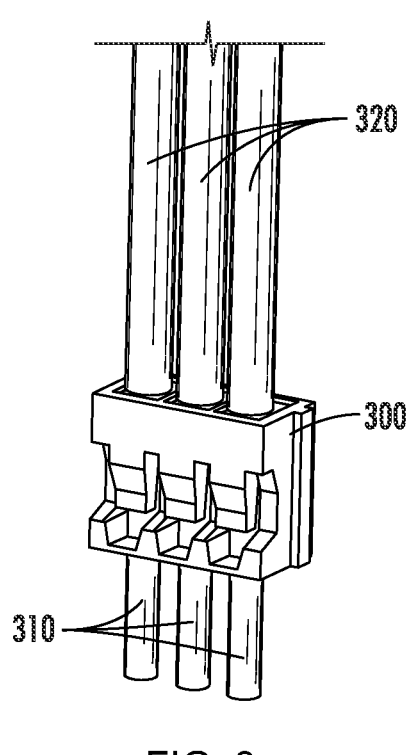
FIG. 3 is a perspective view of electrical wires inserted in a connector housing.

FIG. 3 shows a perspective view of the electrical wires 320 inserted and contained in the connector housing 300. The connector housing 300 may receive the electrical wires 320. The terminal pins 310 may extend beyond the connector housing 300. The terminal pins 310 may comprise a crimp connector terminal. The crimp connector terminal may be of a through-hole terminal type. As previously described, the electrical wires 320 may be configured to connect to vehicle electrical wires. The electrical wires 320 may supply the electricity from the vehicle electrical wires to the LED lighting strip 100 via the electrical contact 200.

Figure 4:
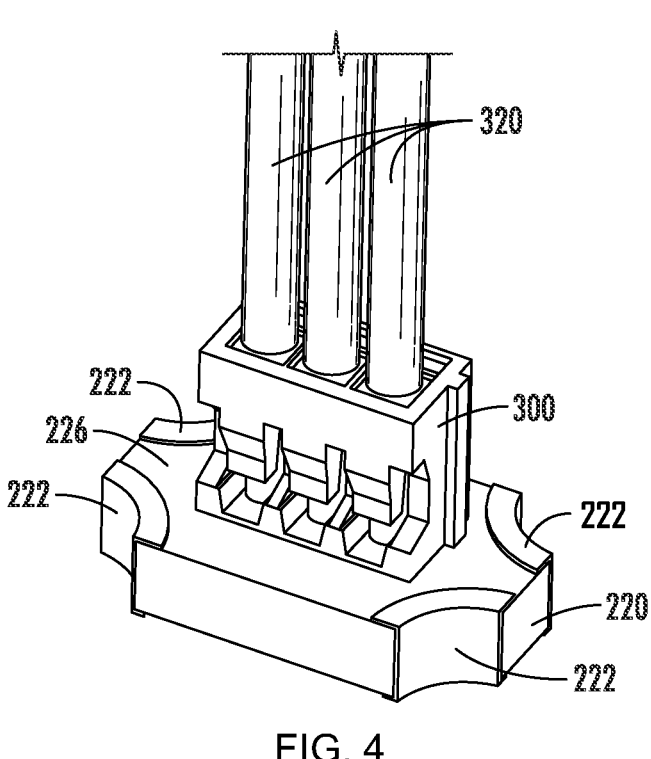
FIG. 4 is a perspective view of terminal pins inserted into the PCB connector.

FIG. 4 shows a perspective view of the terminal pins 310, shown in FIG. 3, inserted into the PCB connector 210. The electrical wires 320 are electrically coupled to the PCB connector 210. Although not visible in FIG. 4, the terminal pins 310 are inserted into the openings 224 of the PCB connector 210. The connector housing 300 may abut the top surface 226 of the connector 220.

Figure 5:
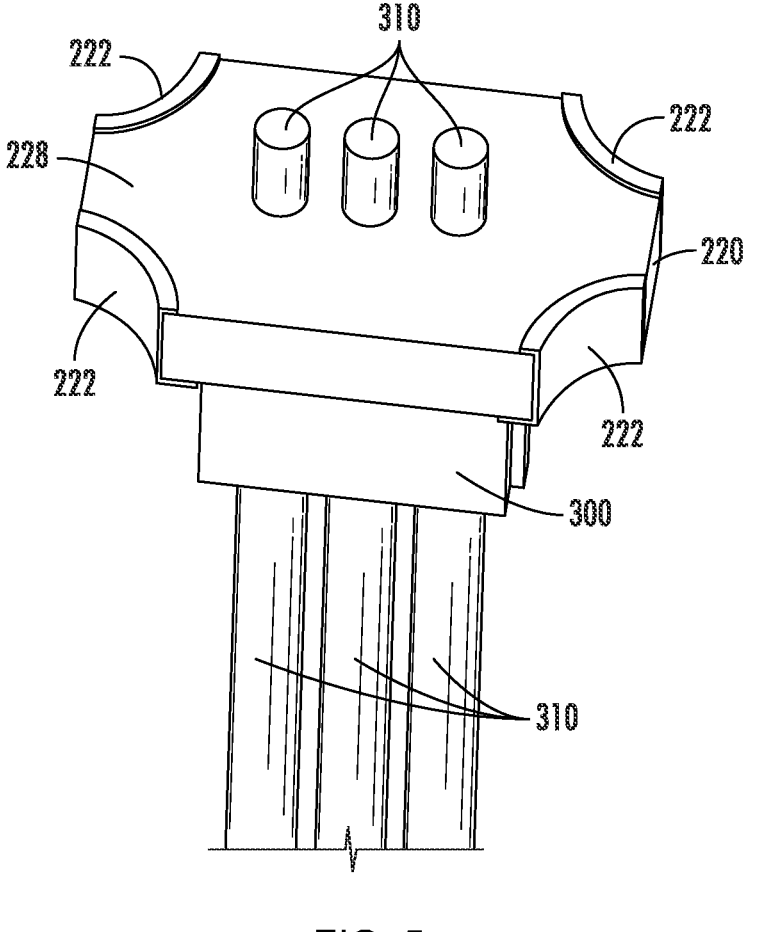
FIG. 5 is a bottom view of FIG. 4.

FIG. 5 is a bottom view of FIG. 4. FIG. 5 shows a perspective view of the bottom surface 228 of the PCB connector 220. As shown in FIG. 5, the terminal pins 310 extend through the PCB connector 220. The terminal pins 310 may be connected to the bottom surface 228 of the PCB connector 220. The terminal pins 310 may be soldered to the bottom surface 228 of the PCB connector 220 by wave soldering.

Figure 6:
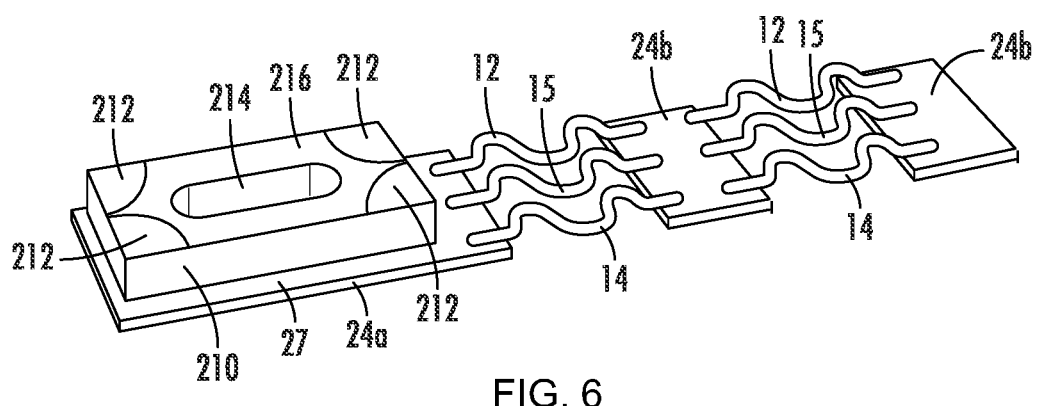
FIG. 6 is a perspective view of a PCB bridge connected to the end interposer of a string of LEDs.

FIG. 6 is a perspective view of the PCB bridge 210 connected to the end interposer 24a of the string of LEDs. In the illustrated example, the PCB bridge 210 is soldered to a top surface 27 of the end interposer 24a. A bottom surface of the end interposer 24a, opposite the top surface 27, may include the LEDs 22. The PCB bridge 210 may be connected to the interposer 24a before the interposer 24a, LEDs 22, and wires 12, 14, 15 are embedded or encapsulated by the housing 52. As shown in FIG. 6, the end interposer 24a may be at least as long as two inner interposers 24b.

Figure 7:
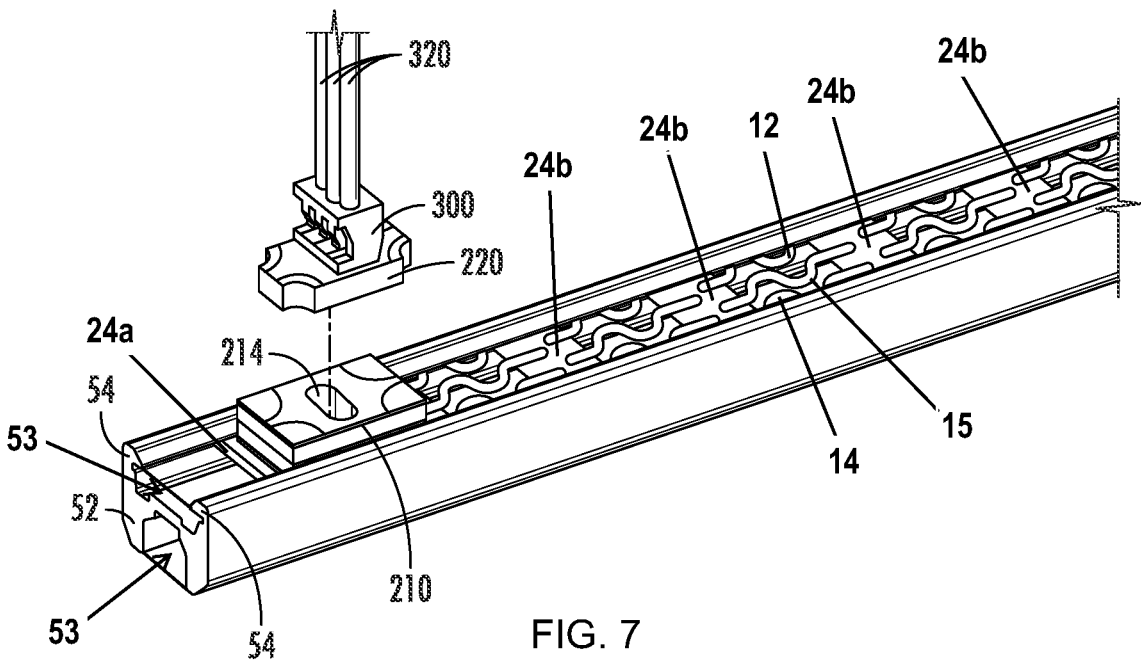
FIG. 7 is a perspective view of the PCB connector aligned with the PCB bridge.

FIG. 7 is a perspective view of the PCB connector 220 aligned with the PCB bridge 210. As shown in FIG. 7, the PCB bridge 210 and string of LEDs may be embedded or encapsulated in the housing 52. The PCB bridge 210 may extend beyond the upper edge 54 of the housing 52. The housing 52 may be filled with the encapsulation material 53 as previously described. The encapsulation material 53 fill the space around the string of LEDs. The encapsulation material 53 mechanically stabilizes the wires 12, 14, 15 and interposers 24a, 24b in the housing 52. The encapsulation material 53 may also provide electrical insulation. The PCB connector 220 may be centered with the opening 214 of the PCB bridge 210 so that the terminal pins 310 of the electrical wires 320 may insert into the opening 214 of the PCB bridge 210.

Figure 8:
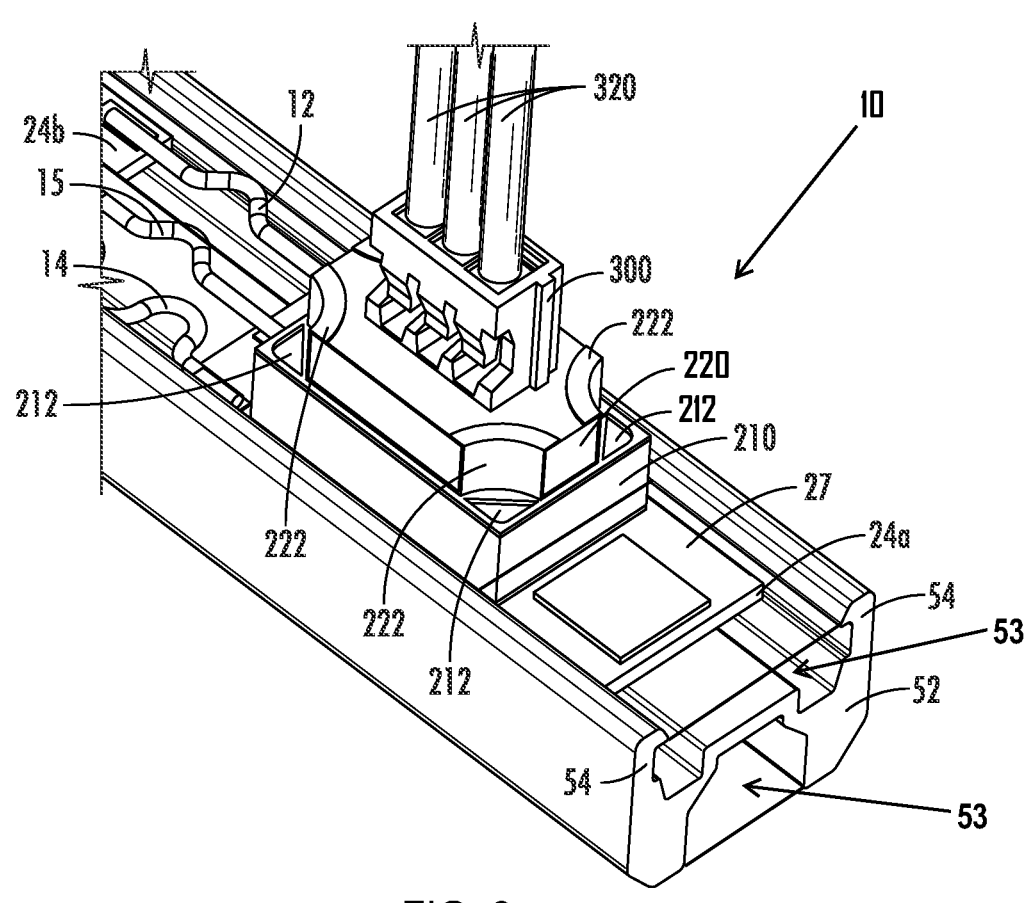
FIG. 8 is a perspective view of the assembled 3D LED with the electrical contact.

FIG. 8 is a perspective view of the assembled example 3D LED string with the electrical contact 10. In the illustrated example, the PCB connector 220 is connected to the PCB bridge 210 with the terminal pins 310 of the electrical wires 320 inserted through the PCB connector 220 and into the PCB bridge 210. The electrical wires 320 may provide power to the LED light string via the PCB connector 220, PCB bridge 210, and interposer 24*a* connection, for example when electrically coupled to vehicle wiring.

Figure 9:
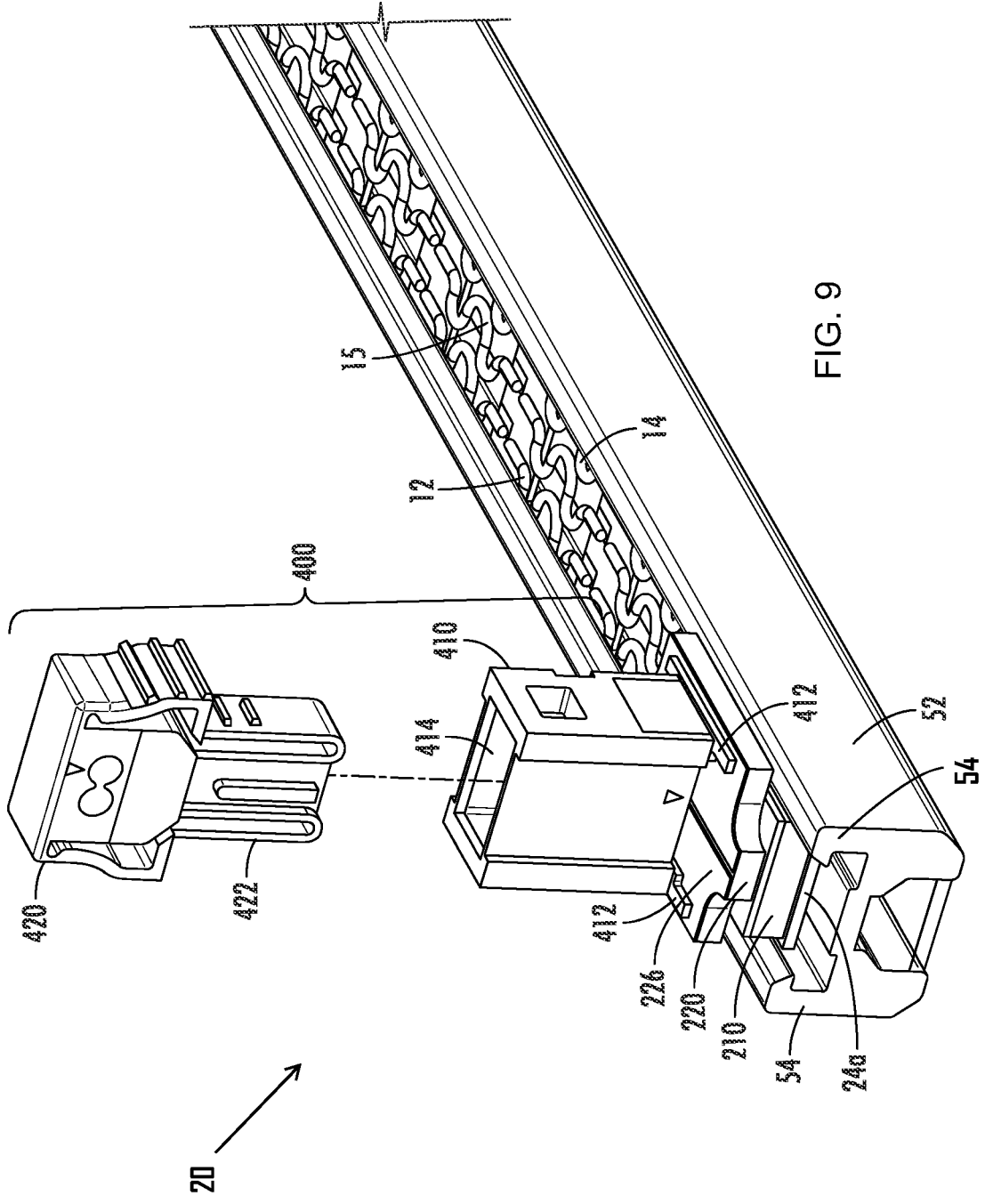
FIG. 9 is a perspective view of a second embodiment of a 3D LED with an electrical contact.
Figure 10:
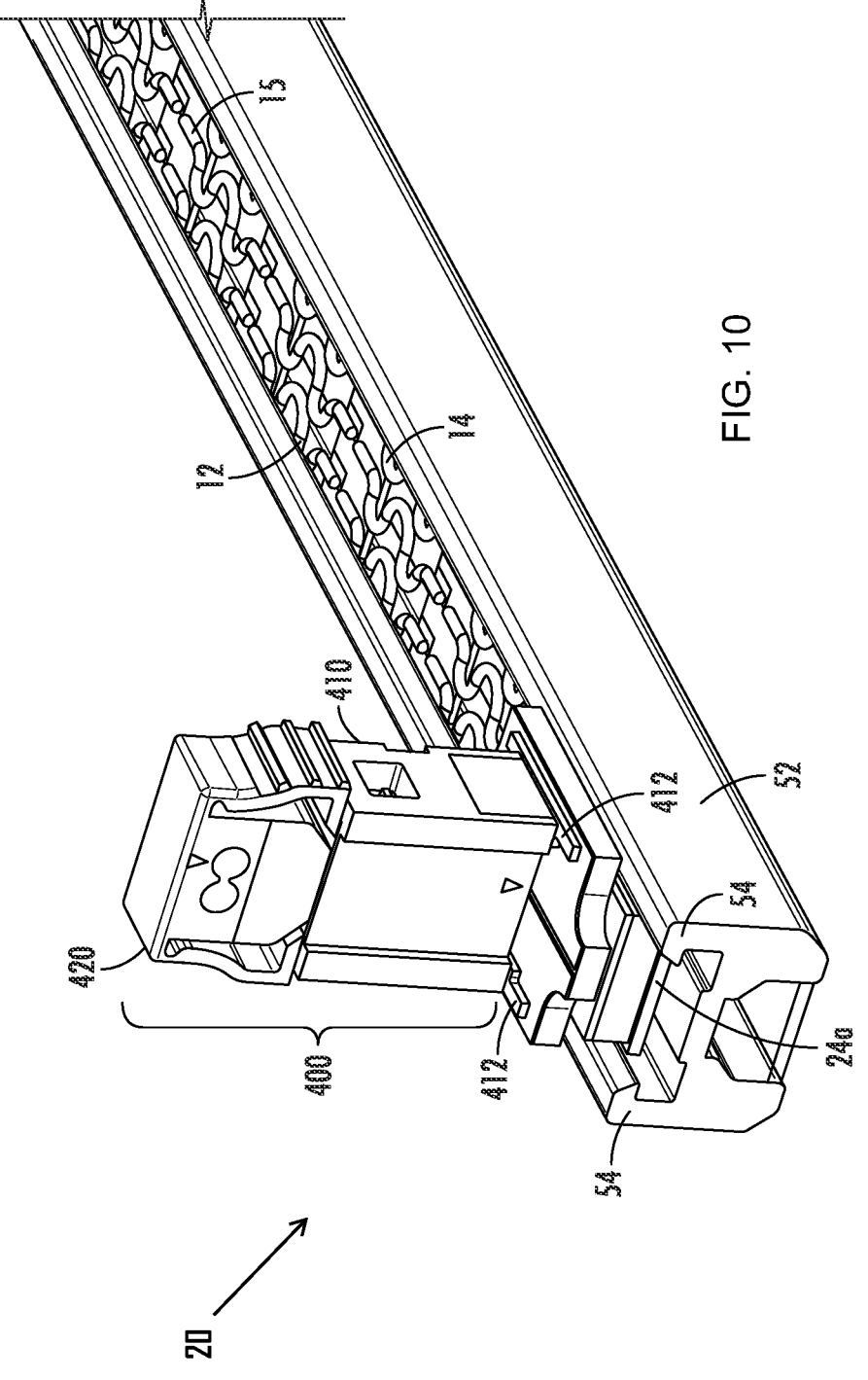
FIG. 10 is another perspective view of the second embodiment of the 3D LED with the electrical contact.

FIGS. 9-10 show an alternative embodiment of an example 3D LED string with an electrical contact 20. The alternative embodiment in FIGS. 9-10 is similar to the previous embodiment, however, the PCB connector 220 is connected to electrical wires 320, shown in FIG. 11-12, via an SMD connection 400. As shown in FIGS. 9-10, the PCB bridge 210 connected to an end interposer 24*a* of an LED string may be embedded or encapsulated in the housing 52 and the encapsulation material 53. A PCB connector 220 may also be connected to the PCB bridge 210. An SMD connector 410 may be connected to the PCB connector 220. The SMD connector 410 may be soldered to the PCB connector 220. The SMD connector 410 may include Surface Mount Technology (SMT) terminations 412. A wire housing 420 may connect electrical wires 320 to the SMD connector 410. The SMD connector 410 and wire housing 420 may be various types of SMD connectors. For example, the SMD connector 410 may be a receptacle type with a female end 414, and the wire housing 420 may be a plug type with a male end 422, as shown in FIG. 9. In this example, the male end 422 of the wire housing 420 may insert into the female end 414 of the SMD connector 410, as shown in FIG. 10. Alternatively, the male and female parts of the connection may be reversed wherein the SMD connector 410 may have a male end and the wire housing 420 may have a female end.

Figure 11:
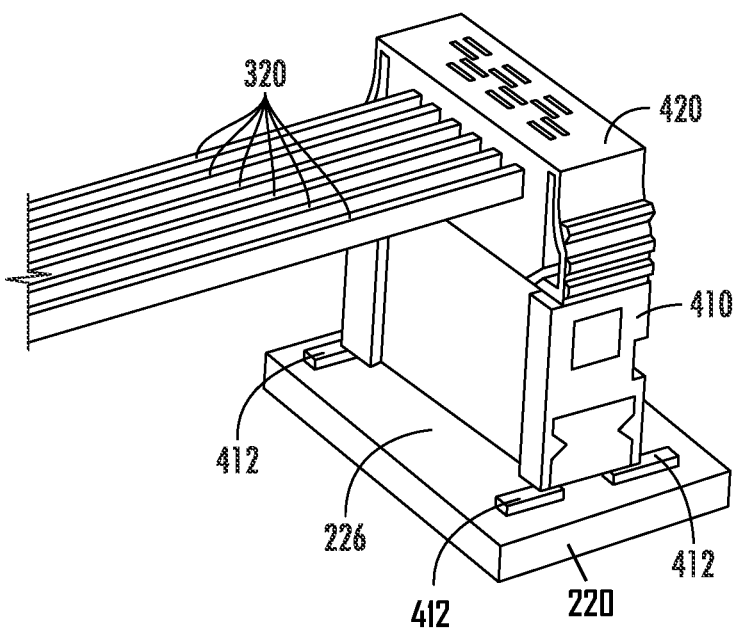
FIG. 11 is a perspective view of a SMD connector connected to the PCB connector and a wire housing connected to the SMD connector.
Figure 12:
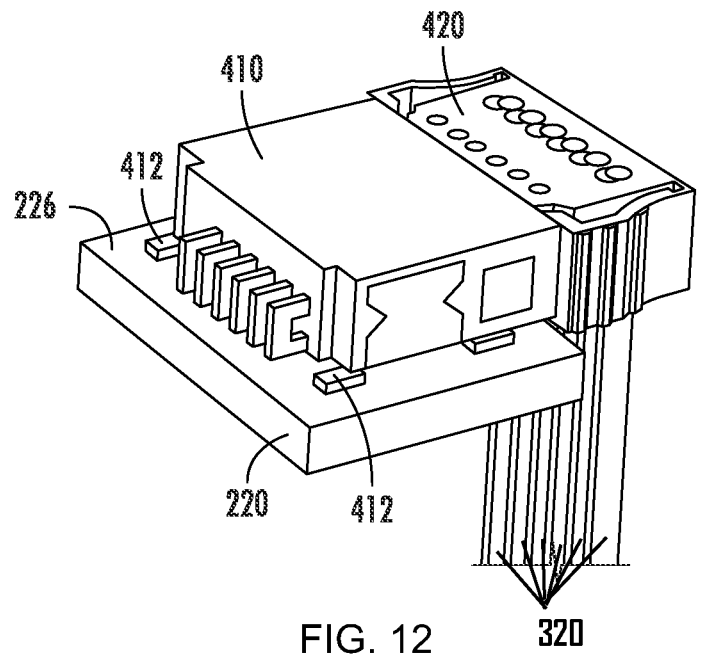
FIG. 12 is a perspective view of a second embodiment of the SMD connector connected to the PCB connector and the wire housing connected to the SMD connector.

As shown in FIGS. 11 and 12, the wire housing 420 may receive and contains the ends of the electrical wires 320. The electrical wires 320 may be inserted into the wire housing 420 at a right angle. The wire housing 420 and the SMD connector 410 may be connected vertically, as shown in FIG. 11, or at an approximate right angle, as shown in FIG. 12.

Figure 13:
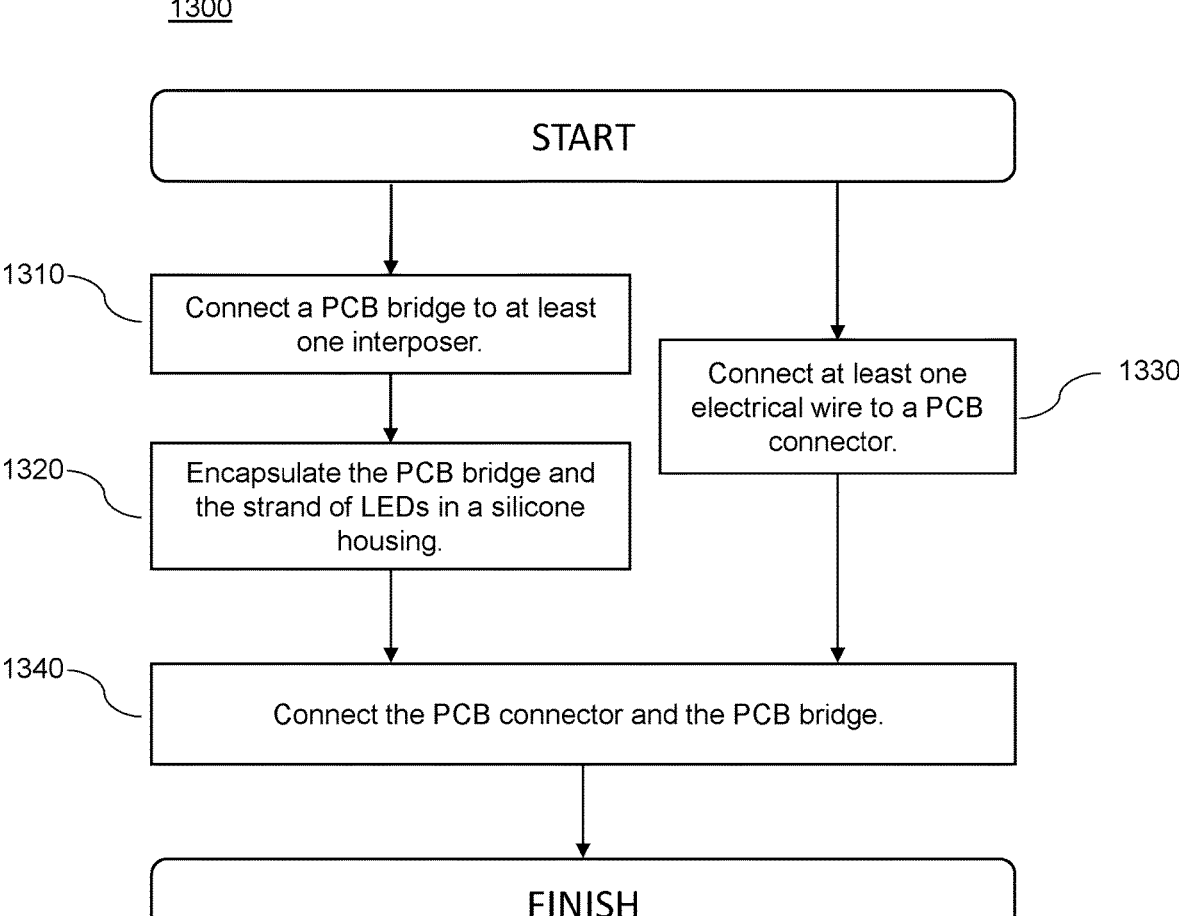
FIG. 13 is a flow chart of a method of manufacturing a 3D LED with an electrical contact.

FIG. 13 shows a flow chart of a method of manufacturing a 3D LED with electrical contact 1300. The 3D LED and electrical contact may be any of the 3D LEDs and electrical contacts described above.

At 1310, a PCB bridge may be connected to at least one interposer. The interposer may be on a backside of at least one LED in a string of LEDs. The interposer may be an end interposer. The PCB bridge may be soldered to the at least one interposer. The string of LEDs with connected PCB bridge may be placed into a silicone housing.

At 1320, the PCB bridge and the string of LEDs, including the at least one interposer, may be encapsulated in the silicone housing. The PCB bridge and the string of LEDs may be encapsulated by filling the silicone housing with encapsulation material. The PCB bridge and the string of LEDs may be encapsulated in the silicone housing by molding liquid silicone around the PCB bridge, the at least one interposer, and the string of LEDs. The PCB bridge may extend beyond the edge of the silicone housing. The PCB bridge may include as least one solder pad.

At 1330, a PCB connector may be connected to at least one electrical wire. The PCB connector may be or include an SMD connector. The SMD connector may be soldered to the PCB connector. A wire housing containing the at least one electrical wire may connect to the SMD connector. Alternatively, at least one terminal pin of the at least one electrical wire may insert and extend through at least one opening in the PCB connector. The at least one terminal pin may be soldered to the PCB connector.

At 1340, the PCB connector may be connected to the PCB bridge. The PCB connector may be soldered to the PCB bridge. The PCB connector may include at least one castellation having at least one solder pad. The solder pads of the castellations of the PCB connector may be soldered to at least one solder pad on the PCB bridge. If at least one terminal pin of at least one electrical wire is extending through the PCB connector, the PCB bridge may include an opening that receives the at least one terminal pin.

Having described the embodiments in detail, those skilled in the art will appreciate that, given the present description, modifications may be made to the embodiments described herein without departing from the spirit of the disclosed concept. Therefore, it is not intended that the scope of the disclosure be limited to the specific embodiments illustrated and described, but the scope of protection is only limited by the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. An electrical contact comprising:
  a printed circuit board (PCB) bridge comprising:
    a top surface,
    a bottom surface opposite the top surface,
    at least one first bridge electrical contact, on the bottom surface of the PCB bridge, configured for electrical coupling with at least one interposer of a string of LEDs, and
    at least one second bridge electrical contact on the top surface of the PCB bridge; and
  a PCB connector comprising:
    a top surface,
    a bottom surface opposite the top surface,
    a plurality of side surfaces,
    a solder pad on at least one of the side surfaces of the PCB connector, the solder pad extending at least to the bottom surface of the PCB connector, and
    at least one opening for receiving at least one external wire,
    wherein the solder pad on the at one of the side surfaces of the PCB connector is electrically and mechanically coupled to the at least one second bridge electrical contact.

2. The electrical contact according to claim 1, wherein the at least one external wire is configured to electrically couple the string of LEDs via the PCB bridge, the PCB connector, and the interposer to power supplied by a vehicle.

3. The electrical contact according to claim 1, further comprising a surface-mount device (SMD) connector electrically coupled to the PCB connector, the SMD connector configured to connect to a wire housing containing the at least one electrical wire.

4. The electrical contact according to claim 1, wherein:
  at least one terminal pin of the at least one electrical wire extends through the at least one opening in the PCB connector, and
  the PCB bridge further comprises at least one other opening configured to receive the at least one terminal pin of the at least one electrical wire.

5. The electrical contact according to claim 1, wherein the at least one of the side surfaces of the PCB connector is at least one castellation formed in at least one corner of the PCB connector.

6. The electrical contact according to claim 1, wherein the PCB bridge extends beyond a silicone housing that encapsulates the string of LEDs.

* * * * *